United States Patent [19]

Nickerson et al.

[11] Patent Number: 5,459,407
[45] Date of Patent: Oct. 17, 1995

[54] APPARATUS AND METHOD OF CORRECTING LOSS OF TEST CONTACT CONTINUITY

[75] Inventors: Larry A. Nickerson, Phoenix; Mavin C. Swapp, Gilbert; Milo W. Frisbie, Mesa, all of Ariz.

[73] Assignee: Motorola, Inc., Schaumburg, Ill.

[21] Appl. No.: 163,626

[22] Filed: Dec. 9, 1993

[51] Int. Cl.[6] .................................................. C01R 31/00
[52] U.S. Cl. ..................... 324/756; 324/757; 324/761; 324/754
[58] Field of Search .................................. 324/756, 757, 324/761, 754

[56] References Cited

U.S. PATENT DOCUMENTS

| | | | |
|---|---|---|---|
| 4,047,780 | 9/1977 | Cedrom | 324/754 |
| 4,225,819 | 9/1980 | Grau et al. | 324/754 |
| 4,471,298 | 9/1984 | Frohlich | 324/757 |
| 4,857,009 | 8/1989 | Christensen | 324/754 |

*Primary Examiner*—Kenneth A. Wieder
*Assistant Examiner*—Kourosh Cyrus Khosravi
*Attorney, Agent, or Firm*—Robert D. Atkins

[57] ABSTRACT

A test fixture operates under the control of a computer to make automatic correction in test contact spacing between the test fixture contact pins and the circuit under test. The computer detects continuity test failures and raises the test fixture to bring the test contact pins into proximity with the leads of the circuit under test. The computer controls rotation of a motor that drives a screw and moves a shaft and wedge assembly in the horizontal direction. A push rod is attached to the test fixture by way of a base plate and angle brackets. The push rod resting on the wedge slide up and down to raise and lower the test fixture.

14 Claims, 1 Drawing Sheet

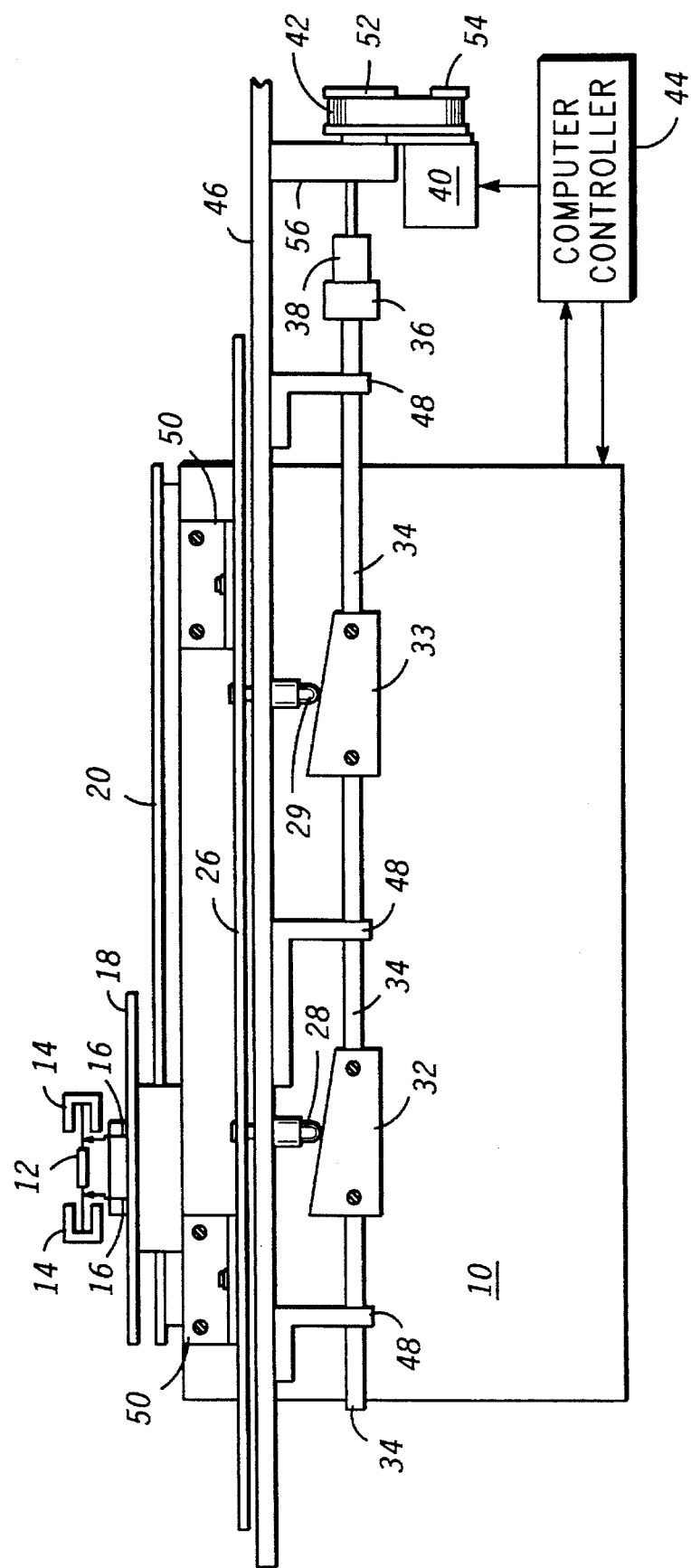

APPARATUS AND METHOD OF CORRECTING LOSS OF TEST CONTACT CONTINUITY

BACKGROUND OF THE INVENTION

The present invention relates in general to semiconductor test fixtures and, more particularly, a semiconductor test fixture that automatically corrects any loss of test contact continuity.

Semiconductor circuit test fixtures are used to functionally exercise semiconductor circuits coming off a semiconductor fabrication line. During test, electrical signals are applied to the input pins of the semiconductor circuit and the corresponding output signals at its output pins are compared against known good responses. When all the test signals on the output pins of the semiconductor circuit match the predetermined responses the circuit under test is accepted. If any output signal should fail to match the expected response, the circuit under test is rejected.

Sometimes, the circuit under test fails because one or more of the leads on the input or output pins is not making good electrical contact with the leads of the test fixture. The circuit under test is rejected even though it may be a good circuit. When this occurs it may be necessary to adjust the contact leads between the circuit under test and the test fixture and rerun the test to avoid rejecting a good circuit. In the past the testing operation is stopped while an operator makes manual adjustments to the contacts. Frequent manual adjustments to the contact leads substantially slows down the testing process.

Hence, a need exists to automatically adjust the contact leads of a test fixture without adversely effecting the testing process efficiency.

BRIEF DESCRIPTION OF THE DRAWING

The sole FIGURE illustrates a test fixture and circuit under test.

DETAILED DESCRIPTION OF THE PREFERRED EMBODIMENT

Referring to FIG. 1, a test fixture 10 is configured to perform an electrical functional test on lead frame 12 which may include one or more encapsulated semiconductor devices, associated leads and a frame. Lead frame 12 moves along guide rails 14 in the manufacturing process, for example by way of a walking beam (not shown), and eventually lines up over test contact pins 16 of test fixture 10.

To perform the functional test, guide rails 14 housing lead frame 12 drop downward so that its leads come into electrical contact with test contact pins 16. Computer controller 44 sends input test signals to test fixture 10 for application to the input leads of lead frame 12 to functional test its semiconductor devices. The output leads of lead frame 12 are monitored by test fixture 10 to determine the response of the semiconductor devices to the input test signals. The output test signals are compared against known good responses by computer controller 44 to determine if the semiconductor devices on lead frame 12 pass test. Alternately, test-fixture 10 may generate its own test signals and determine pass or fail of the device under test. Test fixture 10 passes a test status signal to computer controller 44. Upon passing test, lead frame 12 continues along the manufacturing process. Failed lead frames are rejected and repaired or discarded.

Over a period of testing, test contact pins 16 become worn and shorten in length. Eventually, lead frame 12 fails test because test contact pins 16 are not in electrical contact with the leads of lead frame 12. Nonetheless, test fixture 10 records a failed lead frame assembly even though the semiconductor devices may be good.

A key feature of the present invention is to detect continuity failures between test contact pins 16 and lead frame 12, and automatically adjust test contact pins 16 to make electrical contact with lead frame 12. Accordingly, the results of each electrical test performed by test fixture 10 are sent to computer controller 44. Computer controller 44 detects when lead frame 12 fails and determines whether the failure is likely the result of an open electrical contact between test contact pins 16 and lead frame 12. Techniques of performing continuity tests are well known in electrical test fixtures. Alternately, computer controller 44 may measure the distance lead frame 12 moves after the test contact pins make contact to decide if the required preload needs adjustment.

Assume that lead frame 12 fails continuity check. Computer controller 44 sends a control signal to control the directional rotation of motor 40. Motor 40 is attached to motor pulley 54 which turns timing-belt 42 that is wrapped around timing pulley 52. Motor bracket 56 supports timing pulley 52. Lead screw 38 is fasten to pulley 52 at one end, and attached to clamping bracket 36 at the other end. Clamp bracket 36 is also attached to horizontal shafts 34 that are supported by holding brackets 48 in three places. Holding brackets 48 are fastened to platform 46. Platform 46 is a rigid assembly supporting holding brackets 48, motor bracket 56, which in turn support, horizontal shafts 34, wedges 32–33, clamping bracket 36 lead screw 38, motor 40, and pulleys 52 and 54. Wedges 32 and 33 are fastened to and move in conjunction with horizontal shafts 34. Vertical push rods 28 and 29 rest on wedges 32 and 33, respectively, to slide up and down the incline. Push rods 28 and 29 are attached to base plate 26 with mounting hardware. Angle brackets 50 support test fixture 10 on base plate 26. Load board 20 and contact board 18 are an integral part of test fixture 10.

Test fixture 10 is supported by angle brackets 50 and base plate 26 by way of push rods 28 and 29. In most applications another set of horizontal shafts 34, wedges 32 and 33 and push rods 28 and 29 is necessary to support test fixture 10 on the opposite side for balance (not shown). Pulley 52 rotates lead screw 38 to move shafts 34 in a horizontal direction. If movement in horizontal shaft 34 causes wedges 32 and 33 to move to the right, i.e. wedges drawn closer to the motor, push rods 28 and 29 slide up the incline of wedges 32 and 33 and raise base plate 26 which in turn raises test fixture 10. Test contact pins 16 are thus drawn into proximity to the leads of lead frame 12 as necessary to make solid electrical contact. The electrical test is re-performed.

If it becomes necessary to back-off test contact pin pressure, e.g. new test contact pins installed, computer controller 44 may move horizontal shafts 34 and wedges 32 and 33 to the left causing push rods 28 and 29 slide down the incline of the wedges. Base plate 26 lowers to lower test fixture 10. Test contact pins 16 move farther from the leads of lead frame 12 to make room for the longer test contact pins 16.

In an alternate embodiment, instead of horizontal shafts 34 and wedges 32–33, motor 40 could be connected to vertically mounted worm drives (not shown) that push directly upward on push rods 28 and 29 to raise test fixture 10.

By now it should be appreciated that the present invention provides automatic correction of loss of continuity between test contact pins and the lead frame under test. The computer controller detects continuity failures and raises the test fixture into closer proximity to the lead frame to regain electrical continuity.

While specific embodiments of the present invention have been shown and described, further modifications and improvements will occur to those skilled in the art. It is understood that the invention is not limited to the particular forms shown and it is intended for the appended claims to cover all modifications which do not depart from the spirit and scope of this invention.

What is claimed is:

1. An apparatus for testing a device under test, comprising:

first means having contact leads for applying input test signals to leads of the device under test and providing output test signals;

a control system having an input coupled for receiving said output test signals and having an output coupled for providing a control signal upon detecting a test failure due to lack of continuity between said contact leads and the device under test; and second means responsive to said control signal from said control system indicating said test failure due to lack of continuity for adjusting said contact leads of said first means into proximity to said leads of the device under test to make electrical connection to the device under test.

2. The apparatus of claim 1 wherein said first means includes a test fixture including said contact leads for applying said input test signals to said leads of the device under test.

3. The apparatus of claim 2 wherein said second means includes:

a first bracket fastened to said test fixture;

a base plate fastened to said first bracket for supporting said test fixture; and a first push rod fastened to said base plate for raising said test fixture.

4. The apparatus of claim 3 wherein said second means further includes:

a first wedge supporting said first push rod;

a shaft fastened to said first wedge for moving said first wedge in said horizontal direction to raise said first push rod;

a platform;

a second bracket attached to said platform and supporting said shaft;

a screw attached to said shaft for moving said shaft in a horizontal direction; and a motor rotating said screw in response to said control signal for adjusting said contact leads of said test fixture into proximity to said leads of the device under test to make said electrical connection.

5. The apparatus of claim 4 wherein said second means further includes:

a third bracket fastened to said test fixture and to said base plate for ,supporting said test fixture; and a second push rod fastened to said base plate for raising said test fixture.

6. The apparatus of claim 5 wherein said second means further includes a second wedge supporting said second push rod and fastened to said shaft which moves said second wedge in said horizontal direction to raise said second push rod.

7. The apparatus of claim 6 wherein said second means further includes:

a first pulley attached to said motor;

a second pulley attached to said screw a fourth bracket supporting said second pulley; and a belt wrapped around said first and second pulleys.

8. The apparatus of claim 7 further including a guide rail for housing and transporting the device under test.

9. A method of electrically testing a device under test, comprising the steps of:

applying test signals through contact leads of a test fixture to leads of the device under test;

sending a test signal to a control system following the electrical test;

generating a control signal upon detecting a test failure due to lack of continuity between said contact leads and the device under test;

adjusting said contact leads of said test fixture into proximity to said leads of the device under test in response to said control signal from said control system indicating said test failure due to lack of continuity to make said electrical connection to the device under test;

controlling a motor to rotate in response to said control signal;

rotating a screw with said rotation of said motor;

moving a shaft horizontally by said rotation of said screw;

moving a wedge with said movement of said shaft;

sliding a push rod that is connected to said test fixture up an incline of said wedge; and moving said test fixture upward with said push rod to make said electrical connection.

10. An apparatus for testing a device under test, comprising:

a control system having an input coupled for receiving output test signals and having an output coupled for providing a control signal;

a test fixture having contact leads for applying input test signals to leads of the device under test and sending output test signals to said control system;

a first bracket fastened to said test fixture;

a base plate fastened to said bracket for supporting said test fixture;

a first push rod fastened to said base plate for raising said test fixture;

a first wedge supporting said first push rod;

a shaft fastened to said first wedge for moving said first wedge in a horizontal direction to raise said first push rod;

a second bracket supporting said shaft;

a screw attached to said shaft for moving said shaft in said horizontal direction; and a motor rotating said screw in response to said control signal for adjusting said contact leads of said test fixture into proximity to said leads of the device under test to make electrical connection.

11. The apparatus of claim 10 further including:

a third bracket fastened to said test fixture and to said base plate for supporting said test fixture; and a second push rod fastened to said base plate for raising said test fixture.

12. The apparatus of claim 11 further including a second wedge supporting said second push rod and fastened to said shaft which moves said second wedge in said horizontal direction to raise said second push rod.

13. The apparatus of claim 12 further including:

a first pulley attached to said motor;

a second pulley attached to said screw;

a fourth bracket supporting said second pulley; and a belt wrapped around said first and second pulleys.

14. The test fixture of claim 13 further including a guide rail for housing and transporting the device under test.

* * * * *